(12) United States Patent
Yao (10) Patent No.: US 10,209,430 B2
(45) Date of Patent: Feb. 19, 2019

(54) LED LIGHT SOURCE, BACKLIGHT MODULE AND LIQUID CRYSTAL DISPLAY DEVICE

(71) Applicants: Shanghai Tianma Micro-Electronics Co., Ltd., Shanghai (CN); Tianma Micro-Electronics Co., Ltd., Shenzhen (CN)

(72) Inventor: Lu Yao, Shanghai (CN)

(73) Assignees: SHANGHAI TIANMA MICRO-ELECTRONICS CO., LTD., Pudong New District, Shanghai (CN); TIANMA MICRO-ELECTRONICS CO., LTD., Futian District, Shenzhen (CN)

( * ) Notice: Subject to any disclaimer, the term of this patent is extended or adjusted under 35 U.S.C. 154(b) by 391 days.

(21) Appl. No.: 14/972,056

(22) Filed: Dec. 16, 2015

(65) Prior Publication Data

US 2016/0187566 A1    Jun. 30, 2016

(30) Foreign Application Priority Data

Dec. 26, 2014    (CN) .......................... 2014 1 0855145

(51) Int. Cl.
| | |
|---|---|
| *F21V 8/00* | (2006.01) |
| *G02B 5/02* | (2006.01) |
| *G02F 1/1335* | (2006.01) |
| *H01L 33/58* | (2010.01) |
| *H01L 33/50* | (2010.01) |

(52) U.S. Cl.
CPC .......... *G02B 6/0073* (2013.01); *G02B 6/0025* (2013.01); *G02F 1/133606* (2013.01); *H01L 33/58* (2013.01); *G02B 5/0242* (2013.01); *G02B 6/0068* (2013.01); *G02F 1/133603* (2013.01); *G02F 2001/133607* (2013.01); *H01L 33/507* (2013.01); *H01L 2933/0091* (2013.01)

(58) Field of Classification Search
CPC ................ G02B 6/0073; G02B 6/0023; G02F 1/133603; G02F 2001/133607; G02F 1/133606; G02F 1/133611
USPC ................................................. 362/600–634
See application file for complete search history.

(56) References Cited

U.S. PATENT DOCUMENTS

| | | | | |
|---|---|---|---|---|
| 7,476,003 B2 * | 1/2009 | Kim | ................. | G02F 1/133603 |
| | | | | 362/612 |
| 7,954,989 B2 * | 6/2011 | Fan | ..................... | G02B 6/0025 |
| | | | | 362/610 |
| 8,376,602 B2 * | 2/2013 | Klipstein | ................. | F21L 4/08 |
| | | | | 362/612 |

(Continued)

FOREIGN PATENT DOCUMENTS

| | | |
|---|---|---|
| CN | 1549027 A | 11/2004 |
| CN | 2898855 Y | 5/2007 |
| CN | 101124682 A | 2/2008 |

(Continued)

*Primary Examiner* — William J Carter
(74) *Attorney, Agent, or Firm* — Faegre Baker Daniels LLP (57) ABSTRACT

An LED light source, a backlight module and a liquid crystal display device are disclosed. The LED light source includes: a housing having a light outlet; an LED wafer disposed within the housing, where a light-emitting surface of the LED wafer faces towards the light outlet of the housing; and a light adjustment layer disposed at the light outlet of the housing.

14 Claims, 10 Drawing Sheets

(56) References Cited

U.S. PATENT DOCUMENTS

2010/0165663 A1* 7/2010 Chang ................ G02B 5/0215
362/625
2011/0309390 A1* 12/2011 Liu ..................... H01L 25/0753
257/89

FOREIGN PATENT DOCUMENTS

| CN | 101666459 A | 3/2010 |
| CN | 101867007 A | 10/2010 |
| CN | 103513321 A | 1/2014 |
| CN | 103712155 A | 4/2014 |
| EP | 1729350 A2 | 12/2006 |

* cited by examiner

FIG.1A

-- Prior Art --

FIG.1B

-- Prior Art --

-- Prior Art --

LED LIGHT SOURCE, BACKLIGHT MODULE AND LIQUID CRYSTAL DISPLAY DEVICE

CROSS-REFERENCE TO RELATED APPLICATION

This application claims priority to Chinese Application No. 201410855145.X, filed Dec. 26, 2014, which is herein incorporated by reference in its entirety.

TECHNICAL FIELD

The present disclosure relates to the field of optical technologies and, in particular, to a Light-Emitting Diode (LED) light source, a backlight module and a liquid crystal display device.

BACKGROUND

Semiconductor solid-state illumination is one of the most promising new technologies in the twenty-first century, and is essentially based on a high power LED. With progress in semiconductor material growing technologies and component packaging in recent years, luminous efficiency and reliability of the high power LED components have been greatly improved. The LEDs have been increasingly widely applied, especially in illumination applications and display panels, and a packaged LED device having a larger light-emitting angle is more valuable for either the illumination applications or as a backlight source of a display panel.

Figure 1A:
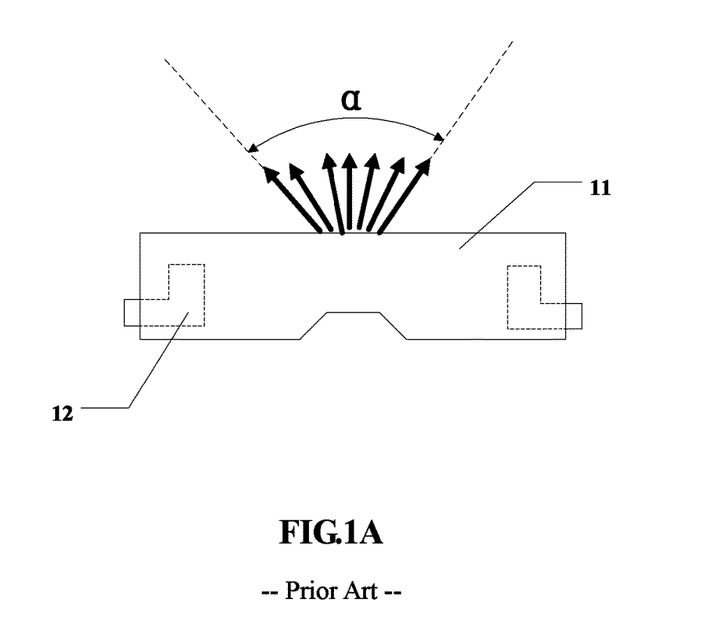
FIG. 1A is a front view of an LED light source in the related art.
Figure 1B:
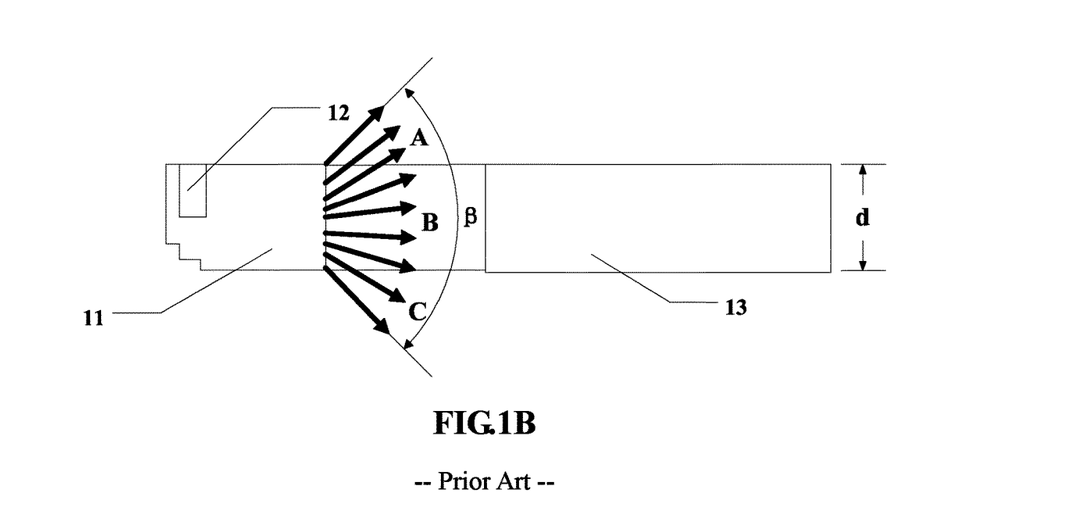
FIG. 1B is a right view of the LED light source in the related art.

In the related art, the light-emitting angle of a power-type LED is generally determined by a cup depth of a support, a lens or a reverse mold die. FIG. 1A and FIG. 1B are a front view and a right view of an LED light source in the related art, respectively.

Referring to FIG. 1A and FIG. 1B, the LED light source in the related art includes a housing 11, an LED wafer (not shown in FIG. 1A and FIG. 1B) disposed within the housing 11 and pins 12. Referring to FIG. 1A, a light-emitting angle a of the LED light source is determined by a cavity of a support thereof. For example, as for an LED light source commonly used in a liquid crystal display module of a mobile phone, the light-emitting angle a of the LED light source depends on the cup depth of the support, the lens or the reverse mold die of the LED light source, and the maximum light-emitting angle a of the LED light source is designed as 120°. The LED light source applied in a side light-emitting backlight module is a spot light source and emits light at a sector shape, and thus an undesirable optical phenomenon of "firefly" (i.e. nonuniform light mixing) is very likely caused when the light-emitting angle is small, thus degrading a display effect. In addition, when the LED light source is applied in a backlight source of a display component of a direct type backlight module, the number of the LED light sources in the backlight module needs to be increased if the light-emitting angle of the LED light sources is small, thus increasing product costs.

Referring to FIG. 1B, the LED light source is a linear light source, thus a light guide plate 13 is required to convert the LED light source adopted as the backlight source into an area light source. However, when the LED light source is disposed at a lateral side of the light guide plate 13, an area illuminated by light of the LED light source, areas A, B, and C, is much larger than the lateral side of the light guide plate 13 because a thickness d of the light guide plate 13 is small and a light-emitting angle β of the LED light source in the thickness direction of the light guide plate 13 is too big, so that the light of the LED light source beyond the thickness of the lateral side of the light guide plate 13, i.e. the light in areas A and C shown in FIG. 1B, is wasted, resulting in low utilization efficiency of the light. That is, the related art is defective in that the light-emitting angle of the LED light source cannot be effectively adjusted.

SUMMARY

In view of the above, the present disclosure provides an LED light source, a backlight module and a liquid crystal display device to achieve effective adjustment of a light-emitting angle of the LED light source.

In one example, an LED light source is provided according to embodiments of the disclosure, and the LED light source includes: a housing having a light outlet; an LED wafer disposed within the housing, where a light-emitting surface of the LED wafer faces towards the light outlet of the housing; and a light adjustment layer disposed at the light outlet of the housing.

In another example, a backlight module is provided according to embodiments of the disclosure, and the backlight module includes: a plurality of the above LED light sources and a light guide plate; where the LED light sources are located in the same plane and form a backlight source array, and a plane where the backlight source array is located is right below the light guide plate; or, the LED light sources are located at a side surface of the light guide plate and are located in the same plane, and a plane where the LED light sources are located is parallel to the side surface of the light guide plate.

In another example, a liquid crystal display device is provided according to embodiments of the disclosure, and the liquid crystal display device includes: a liquid crystal display panel and the above backlight module.

With the LED light source, the backlight module and the liquid crystal display device provided according to the disclosure, adjustment of a light-emitting angle of the LED light source can be achieved by a light adjustment layer disposed at a light outlet of a housing of the LED light source, where the structure of the light adjustment layer can be designed as desired. For example, as for an LED light source commonly used in the liquid crystal display module, a light-emitting angle of the LED light source can be increased by the disposed light adjustment layer to prevent the undesirable optical phenomenon such as the "firefly" phenomenon in the related art; or, as for an LED light source disposed at a side of a light guide plate, light beams in a certain plane can be gathered by the disposed light adjustment layer so that the utilization efficiency of the light source is increased.

While multiple embodiments are disclosed, still other embodiments of the disclosure will become apparent to those skilled in the art from the following detailed description, which shows and describes illustrative embodiments of the disclosure. Accordingly, the drawings and detailed description are to be regarded as illustrative in nature and not restrictive.

While the disclosure is amenable to various modifications and alternative forms, specific embodiments have been shown by way of example in the drawings and are described in detail below. The intention, however, is not to limit the disclosure to the particular embodiments described. On the contrary, the disclosure is intended to cover all modifications, equivalents, and alternatives falling within the scope of the disclosure as defined by the appended claims.

DETAILED DESCRIPTION

The disclosure will be further illustrated in detail below in conjunction with the accompanying drawings and embodiments. It may be understood that specific embodiments described herein are merely for explaining the disclosure rather than limiting the disclosure. Additionally, it is noted that merely partial structures associated with the disclosure rather than all structures are illustrated in the accompanying drawings for ease of description.

Figure 2:
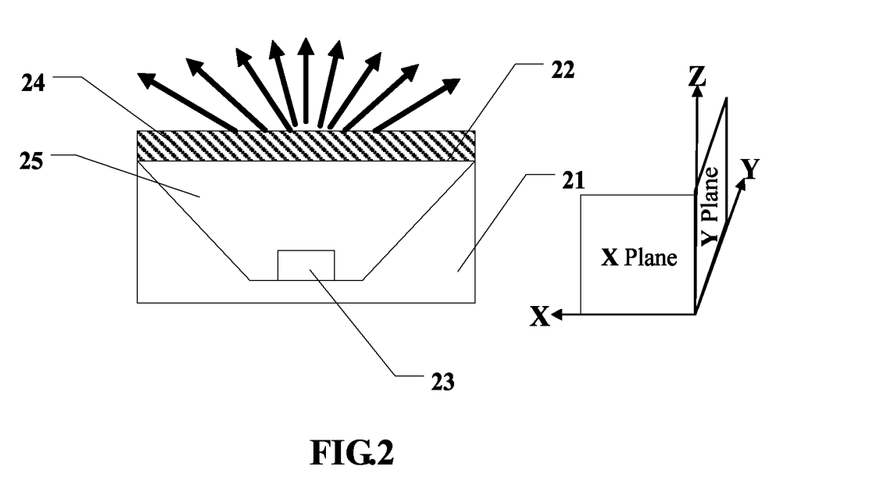
FIG. 2 is a schematic diagram of a cross-section structure of an LED light source, according to embodiments of the disclosure.

An LED light source is provided according to embodiments of the disclosure. As shown in FIG. 2, which is a schematic diagram of a cross-section structure of an LED light source, according to embodiments of the disclosure, the LED light source includes: a housing 21, which has a light outlet 22 through which light is allowed to pass; an LED wafer 23 disposed within the housing 21, where a light-emitting surface of the LED wafer 23 faces towards the light outlet 22 of the housing 21; and a light adjustment layer 24 disposed at the light outlet 22 of the housing 21. Light emitted by the LED light source includes light in a plane X and light in a plane Y perpendicular to the plane X, and the plane X and the plane Y are perpendicular to a plane where the light outlet 22 is located. Illustratively, the plane X is defined as a plane of the cross-section shown in FIG. 2, i.e. a plane defined by an X-axis and a Z-axis in FIG. 2; and the plane Y is perpendicular to the plane of the cross-section in FIG. 2, i.e. a plane defined by the Y-axis and the Z-axis in FIG. 2, and the plane where the light outlet is located is a plane defined by the X-axis and the Y-axis in FIG. 2. The light adjustment layer is configured to adjust the light emitted by the LED light source as desired, for example, to increase a light-emitting angle in at least one of the plane X or the plane Y, thus diffusing the light emitted by the LED light source in at least one of the plane X or the plane Y, so that the problem of the undesirable optical phenomenon of "firefly" in the related art can be solved. Besides, due to the increase of the light-emitting angle of the individual LED light sources, the number of the LED light sources in a backlight module can be reduced when the LED light sources are adopted in a backlight source of a large-sized display device, so as to reduce product costs. With the LED light source, according to embodiments of the disclosure, the light-emitting angle in at least one of the plane X or the plane Y may be alternatively decreased by the light adjustment layer as desired, so that light emitted by the LED light sources is gathered in at least one of the plane X or the plane Y, and hence gathered within the thickness range of the light guide plate, thus increasing the utilization efficiency of the light sources.

It is noted that the LED wafer may be in a circular shape or a square shape, which is not limited in embodiments of the disclosure. The directions of the above planes X and Y are merely intended for clearly describing embodiments rather than limiting the disclosure. Alternatively, the plane Y may be the plane of the cross-section in FIG. 2, and the plane X is perpendicular to the plane of the cross-section in FIG. 2 and is perpendicular to the plane where the light outlet 22 is located. In addition, various components of the LED light source shown in FIG. 2 are merely intended for simply showing a basic structure of the LED light source, according to embodiments of the disclosure, and relative locations of the components, rather than limiting shape features of the various components.

Further, in embodiments, the LED light source further includes a packaging adhesive 25 for packaging the LED wafer into the housing 21. The packaging adhesive 25 may be a phosphor, i.e. a packaging adhesive doped by phosphor powder. The phosphor has a light emitting surface facing towards the light outlet 22 of the housing 21. White light can be emitted by the cooperating of the LED wafer with the phosphor powder in the phosphor, e.g., the cooperating of the blue LED wafer with yellow phosphor powder.

Optionally, the light adjustment layer in the LED light source, according to embodiments of the disclosure, includes a scattering layer configured to diffuse light emitted by the LED light source in at least one of the plane X or the plane Y to increase the light-emitting angle of the LED light source.

Figure 3:
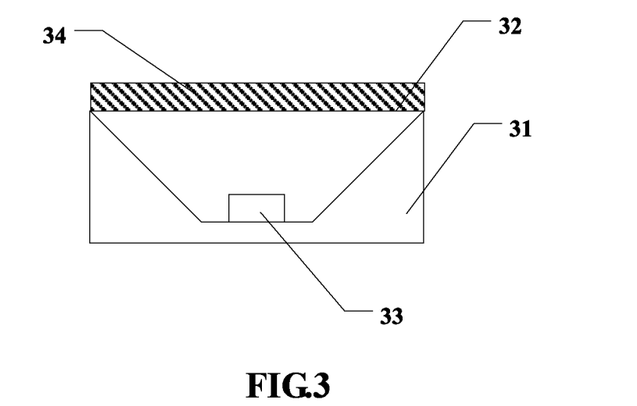
FIG. 3 is a schematic diagram of a cross-section structure of another LED light source, according to embodiments of the disclosure.

FIG. 3 is a schematic diagram of a cross-section structure of another LED light source, according to embodiments of the disclosure. Referring to FIG. 3, the LED light source includes: a housing 31, which has a light outlet 32 through which light is allowed to pass; an LED wafer 33 disposed within the housing 31, where a light-emitting surface of the LED wafer 33 faces towards the light outlet 32 of the housing 31; and a scattering layer 34 located at the light outlet 32 of the housing 31. The scattering layer 34 is laid on the whole light outlet 32 and can scatter all the light emitted by the LED light source in order to increase the light-emitting angle of the LED light source.

Figure 4:
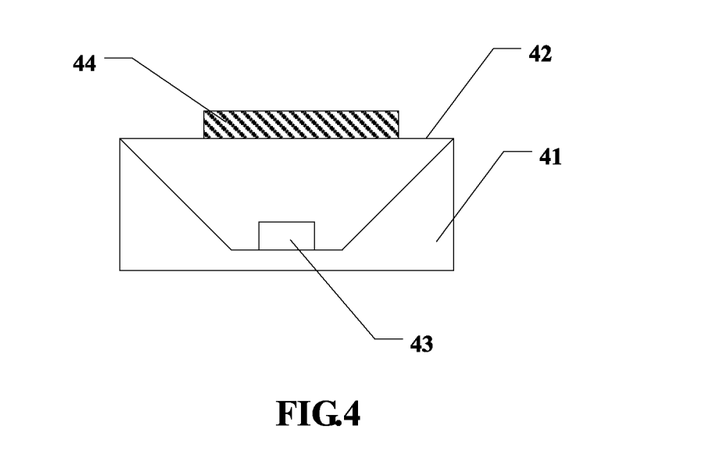
FIG. 4 is a schematic diagram of a cross-section structure of another LED light source, according to embodiments of the disclosure.

FIG. 4 is a schematic diagram of a cross-section structure of yet another LED light source, according to embodiments of the disclosure. Referring to FIG. 4, the LED light source includes a housing 41, which has a light outlet 42 through which light is allowed to pass; an LED wafer 43 disposed within the housing 41, where a light-emitting surface of the LED wafer 43 faces towards the light outlet 42 of the housing 41; and a scattering layer 44 located at the light outlet 42 of the housing 41. The scattering layer 44 is laid on a part of the light outlet 42 to scatter a part of the light emitted from the LED light source. The specific location of the scattering layer 44 on the light outlet 42 and the size of the part of the light outlet 42 on which the scattering layer 44 is laid are not limited in the embodiments of FIG. 4.

By comparing the LED light sources shown in FIG. 3 and FIG. 4, the LED light source shown in FIG. 4 has a lower light loss and higher luminance, while the LED light source shown in FIG. 3 leads to higher efficiency of scattering the light emitted by the LED light source.

Optionally, the scattering layer laid on a part of the light outlet is located at a central position of the light outlet. In such case, the efficiency of scattering the light is increased because of relatively high luminous intensity at the central position of the light outlet of the LED light source, thus further increasing the light-emitting angle.

Optionally, the scattering layer is a transparent colloidal particle layer in which the transparent colloidal particles may include at least one of SiO2 particles, acrylic particles or nylon particles. Illustratively, embodiments of the disclosure provide a method of fabricating the transparent colloidal particle layer, which includes: mixing the transparent colloidal particles with a ultraviolet (UV) curing adhesive, then coating the mixture including the transparent colloidal particles and the UV curing adhesive to a plane of the light outlet, and subsequently forming the transparent colloidal particle layer by UV curing. The filling density of the transparent colloidal particles in the transparent colloidal particle layer is not limited in the disclosure, and can be designed as desired by the light-emitting angle. The higher filling density of the transparent colloidal particles in the transparent colloidal particle layer leads to the better scattering effect and the larger light-emitting angle.

Optionally, the particle radius of the transparent colloidal particles is in a range of 3 μm to 5 μm. A refractive index of the transparent colloidal particle can be adjusted by varying the particle radius of the transparent colloidal particle, so that light scattering at the surface of the transparent colloidal particle is affected, thus affecting the light-emitting angle of the LED light source.

Figure 5:
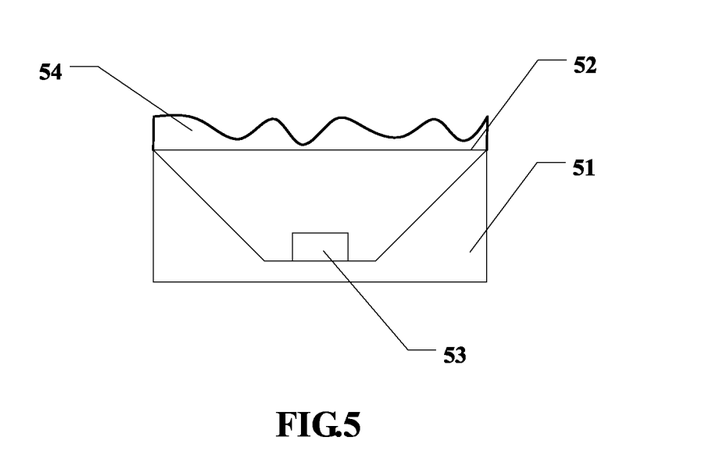
FIG. 5 is a schematic diagram of a cross-section structure of another LED light source, according to embodiments of the disclosure.

FIG. 5 is a schematic diagram of a cross-section structure of another LED light source, according to embodiments of the disclosure, and a scattering layer shown in FIG. 5 is a layer with a concave convex surface formed by ionizing a phosphor surface. As shown in FIG. 5, the LED light source includes: a housing 51, which has a light outlet 52 through which light is allowed to pass; an LED wafer 53 disposed within the housing 51, where a light-emitting surface of the LED wafer 53 faces towards the light outlet 52 of the housing 51; and a scattering layer 54 located at the light outlet 52 of the housing 51. Light emitted from the LED light source can be scattered by the concave convex structure on the surface of the scattering layer 54 so that the light-emitting angle is increased. It is noted that a method of forming the layer with the concave convex surface from a phosphor surface is not limited in the embodiments of the disclosure, for example, the layer with the concave convex surface may be alternatively formed by an etching method.

Figure 6A:
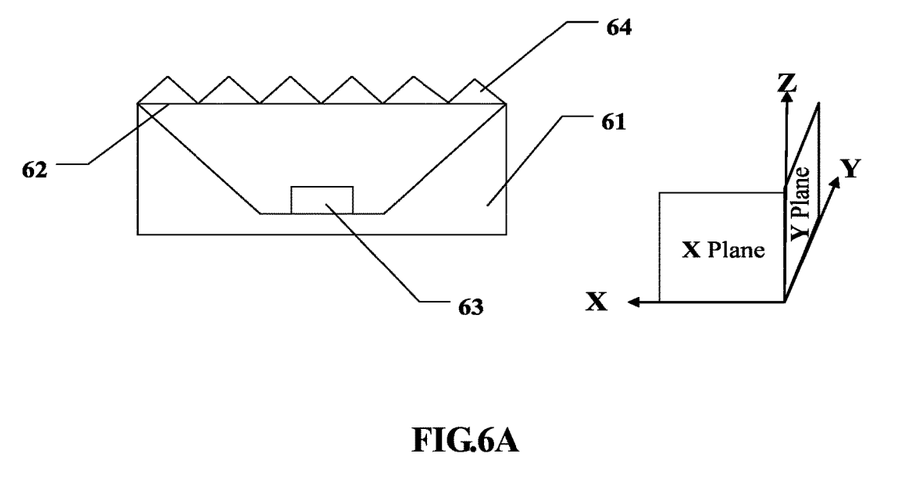
FIG. 6A is a schematic diagram of a cross-section structure of another LED light source, according to embodiments of the disclosure.
Figure 6B:
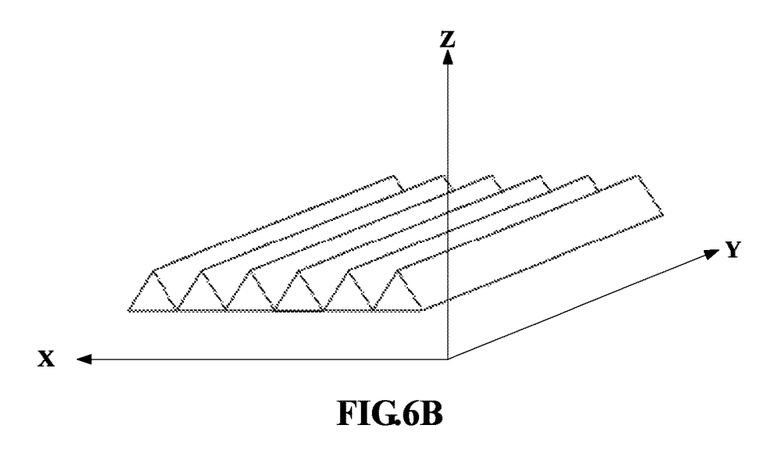
FIG. 6B is a schematic structural view of a prism layer of the LED light source shown in FIG. 6A.

Embodiments of the disclosure provide an LED light source, a light adjustment layer of which includes a light gathering layer configured to gather light emitted by the LED light source in at least one of the plane X or the plane Y, so as to decrease a light-emitting angle in the at least one of the plane X or the plane Y. FIG. 6A is a schematic diagram of a cross-section structure of another LED light source provided according to an embodiment of the present disclosure. Referring to FIG. 6A, the LED light source includes: a housing 61, which has a light outlet 62 through which light is allowed to pass; an LED wafer 63 disposed within the housing 61, where a light-emitting surface of the LED wafer 63 faces towards the light outlet 62 of the housing 61; and a prism layer 64 located at the light outlet 62 of the housing 61. The prism layer 64 is the light gathering layer and includes prism structure units arranged sequentially. The prism structure units are triangular prisms, which are arranged close to each other. Illustratively, the plane X is defined as a plane of a cross-section shown in FIG. 6A, i.e. a plane defined by the X-axis and Z-axis in FIG. 6A, the plane Y is perpendicular to the plane of the cross-section in FIG. 6A, i.e. a plane defined by the Y-axis and the Z-axis in FIG. 6A, and the plane where the light outlet is located is a plane defined by the X-axis and the Y-axis in FIG. 6A. FIG. 6B is a schematic structural view of a prism layer of the LED light source shown in FIG. 6A. Referring to FIG. 6B, the triangular prisms in the prism layer 64 are arranged close to each other without gaps therebetween, and are arranged in parallel along the Y-axis direction to limit light in the plane X in FIG. 6A, i.e. a light-emitting angle of the LED light source shown in FIG. 6A is reduced in the plane X, thereby gathering light in the plane X.

As shown in FIG. 6B, the triangular prisms in the prism layer 64 are arranged close to each other without gaps, and are arranged in parallel along the Y-axis direction, which is an example of the structure of the prism layer. It is also possible that the triangular prisms in the prism layer 64 are arranged in parallel along an X-axis direction to limit light in the plane Y, so that the light-emitting angle of the LED light source is decreased in the plane Y, thereby gathering light in the plane Y.

Figure 7A:
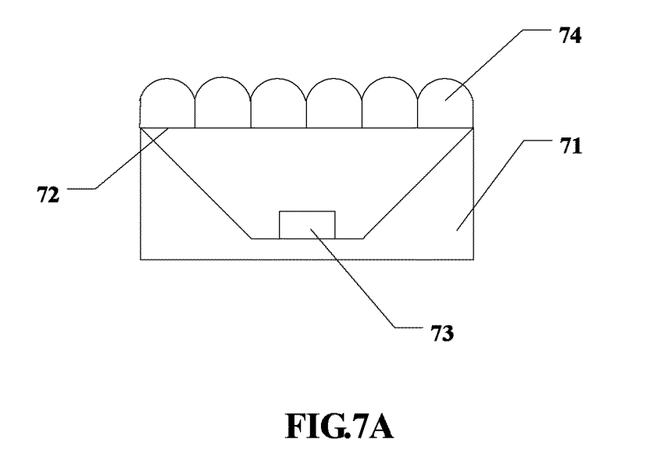
FIG. 7A is a schematic diagram of a cross-section structure of another LED light source, according to embodiments of the disclosure.
Figure 7B:
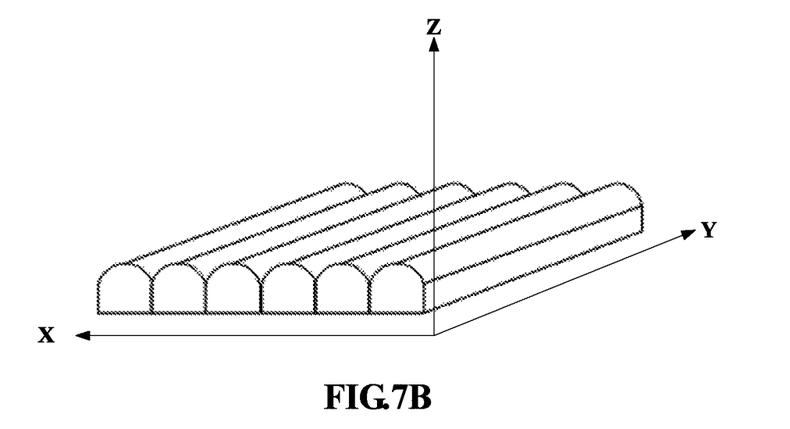
FIG. 7B is a schematic structural view of the prism layer of the LED light source shown in FIG. 7A.

Optionally, the prism structure unit may alternatively be a wavy prism having a wave-shaped cross section. Referring to FIGS. 7A and 7B, FIG. 7A is a schematic diagram of a cross-section structure of another LED light source, according to embodiments of the disclosure, the LED light source shown in FIG. 7A includes: a housing 71, which has a light outlet 72 through which light is allowed to pass; an LED wafer 73 disposed within the housing 71, where a light-emitting surface of the LED wafer 73 faces towards the light outlet 72 of the housing 71; and a prism layer 74 located at the light outlet 72 of the housing 71. FIG. 7B is a schematic structural view of the prism layer of the LED light source shown in FIG. 7A.

Figure 8A:
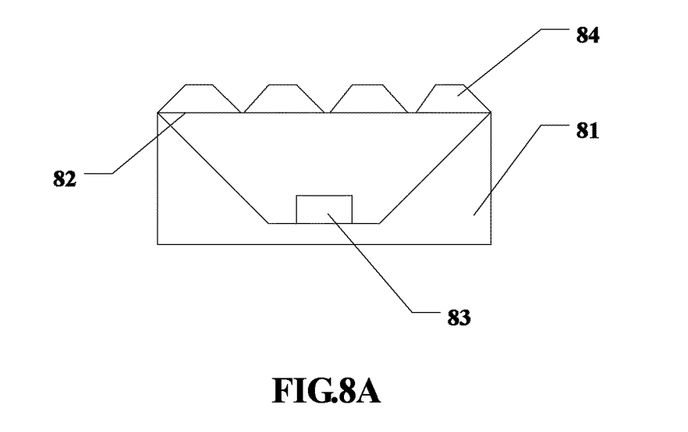
FIG. 8A is a schematic diagram of a cross-section structure of another LED light source, according to embodiments of the disclosure.
Figure 8B:
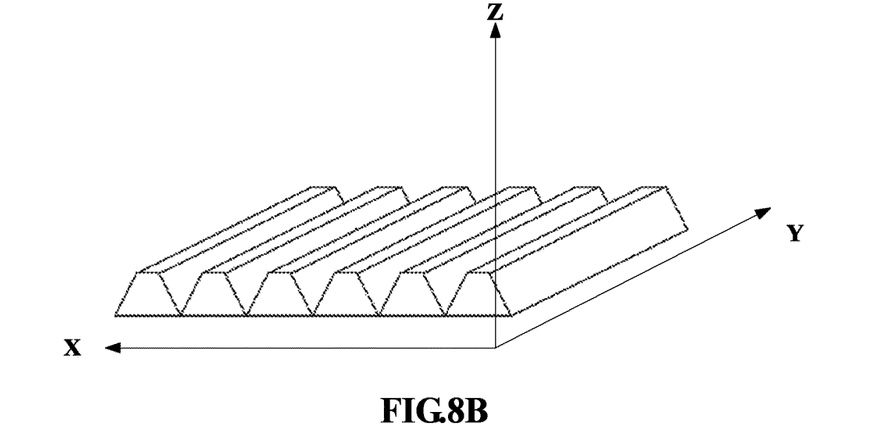
FIG. 8B is a schematic structural view of the prism layer of the LED light source shown in FIG. 8A.

Optionally, the prism structure unit may alternatively be a trapezoidal prism having a trapezoidal cross section. Referring to FIGS. 8A and 8B, FIG. 8A is a schematic diagram of a cross-section structure of another LED light source, according to embodiments of the disclosure, and the LED light source shown in FIG. 8A includes: a housing 81, which has a light outlet 82 through which light is allowed to pass; an LED wafer 83 disposed within the housing 81, where a light-emitting surface of the LED wafer 83 faces towards the light outlet 82 of the housing; and a prism layer 84 located at the light outlet 82 of the housing 81. FIG. 8B is a schematic structural view of the prism layer of the LED light source shown in FIG. 8A.

Similar to the arrangement of the above prism structure unit which is a triangular prism, the prism structure units in FIGS. 8A and 8B may be arranged in parallel along the X-axis direction, and may alternatively be arranged in parallel along the Y-axis direction, thereby gathering light in a different plane.

Figure 9:
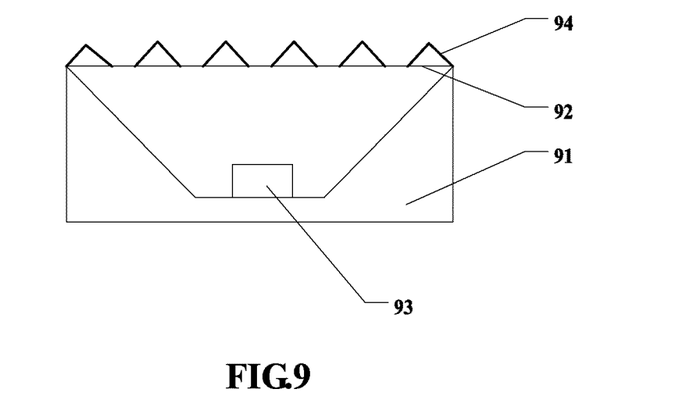
FIG. 9 is a schematic diagram of a cross-section structure of another LED light source, according to embodiments of the disclosure.
Figure 10:
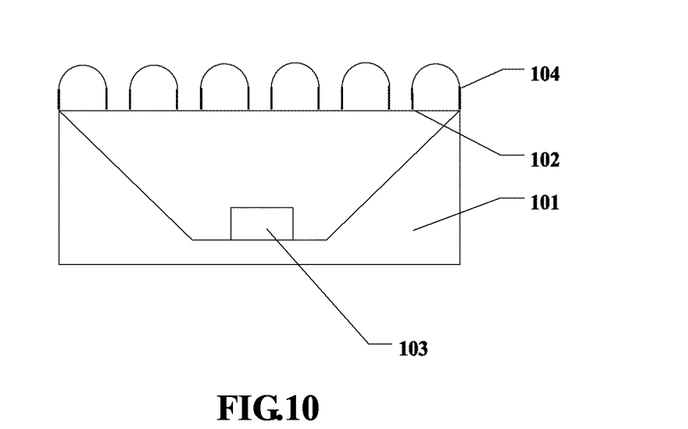
FIG. 10 is a schematic diagram of a cross-section structure of another LED light source, according to embodiments of the disclosure.
Figure 11:
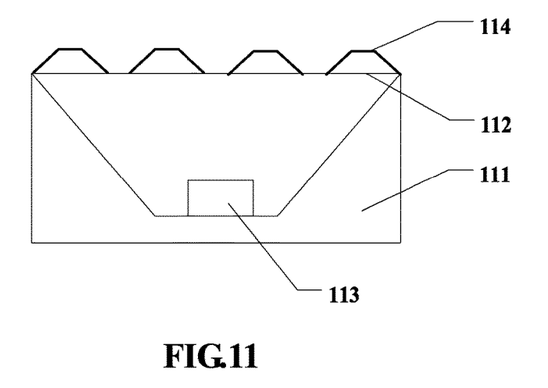
FIG. 11 is a schematic diagram of a cross-section structure of another LED light source, according to embodiments of the disclosure.

Optionally, the prism structure units can be arranged to be spaced from each other. Referring to FIGS. 9 to 11, where FIG. 9 is a schematic diagram of a cross-section structure of another LED light source, according to embodiments of the disclosure, the LED light source shown in FIG. 9 includes: a housing 91, which has a light outlet 92 through which light is allowed to pass; an LED wafer 93 disposed within the housing 91, where a light-emitting surface of the LED wafer 93 faces towards the light outlet 92 of the housing 91; and a prism layer 94 located at the light outlet 92 of the housing 91. The prism structure unit of the LED light source shown in FIG. 9 is a triangular prism, and adjacent triangular prisms are spaced by a gap. FIG. 10 is a schematic diagram of a cross-section structure of another LED light source, according to embodiments of the disclosure, and the LED light source shown in FIG. 10 includes: a housing 101, which has a light outlet 102 through which light is allowed to pass; an LED wafer 103 disposed within the housing 101, where a light-emitting surface of the LED wafer 103 faces towards the light outlet 102 of the housing; and a prism layer 104 located at the light outlet 102 of the housing 101. The prism structure unit of the LED light source shown in FIG. 10 is a wavy prism having a wave-shaped cross section, and adjacent wavy prisms are spaced by a gap. FIG. 11 is a schematic diagram of a cross-section structure of another LED light source, according to embodiments of the disclosure, and the LED light source shown in FIG. 11 includes: a housing 111, which has a light outlet 112 through which light is allowed to pass; an LED wafer 113 disposed within the housing 111, where a light-emitting surface of the LED wafer 113 faces towards the light outlet 112 of the housing; and a prism layer 114 located at the light outlet 112 of the housing 111. The prism structure unit of the LED light source shown in FIG. 11 is a trapezoidal prism having a trapezoidal cross section, and adjacent trapezoidal prisms are spaced by a gap. It is noted that a size of the gap between two adjacent prism structure units in the LED light source may vary as desired in embodiments. With the arrangement of the gaps between adjacent prism structure units, luminance of the LED light source may be increased while confining light emitted by the LED light source.

Optionally, the prism layer is formed by a coated or transfer printed UV curing adhesive. Here, the transfer printing refers to: manufacturing the prism layer, and then attaching the prism layer at the light outlet of the LED light source through a transparent adhesive such as the UV curing adhesive. The coating refers to: directly preparing the prism layer at the light outlet, for example by spin-coating the UV curing adhesive at the light outlet, curing the UV curing adhesive and then etching the cured UV curing adhesive to form the prism structure units. A method of fabricating the prism layer is not limited in embodiments of the disclosure.

Similar to the configuration of the scattering layer in the above embodiments, the light adjustment layer may be laid on the whole light outlet, or may be laid on a part of the light outlet to increase luminance of the LED light source.

Figure 12:
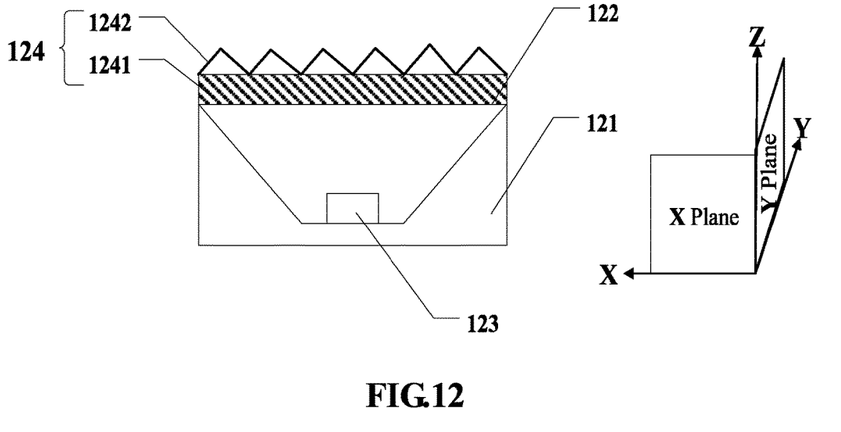
FIG. 12 is a schematic diagram of a cross-section structure of another LED light source, according to embodiments of the disclosure.

Based on the above embodiments, an LED light source is further provided according to embodiments of the disclosure. Referring to FIG. 12 which is a schematic diagram of a cross-section structure of another LED light source, according to embodiments of the disclosure, the LED light source provided according to embodiments of the disclosure includes: a housing 121, which has a light outlet 122 through which light is allowed to pass; an LED wafer 123 disposed within the housing 121, where a light-emitting surface of the LED wafer 123 faces towards the light outlet 122 of the housing 121; and a light adjustment layer 124 disposed at the light outlet 122 of the housing 121. The light adjustment layer 124 includes a scattering layer 1241 and a light gathering layer 1242 located on the scattering layer 1241. Illustratively, for ease of description of the embodiments, the light gathering layer 1242 is shown as a prism layer including prism structure units which are triangular prisms arranged close to each other. It is also possible that the light gathering layer in the LED light source, according to embodiments employs the light gathering layers of other structures described in the above embodiments.

In the LED light source provided according to embodiments of the disclosure, the light adjustment layer includes the scattering layer and the light gathering layer, thus the light entering into the scattering layer can be scattered and the light in a certain plane can be gathered as desired. The description is also described by an example of the LED light source shown in FIG. 12, where the plane X is a plane defined by the X axis and the Z axis, i.e. a plane of the cross-section shown in FIG. 12, and the plane Y is a plane defined by the Y axis and the Z axis, i.e. a plane perpendicular to the plane of the cross-section shown in FIG. 12; and a plane where the light outlet is located is the plane defined by the X axis and the Y axis in FIG. 12. The scattering layer 1241 can scatter light in the plane X and the plane Y, and prism structure units in the light gathering layer 1242 on the scattering layer 1241 are arranged in parallel with the Y-axis, so that the light in the plane X is confined by the light gathering layer 1242, thus gathering light in the plane X. Therefore, the LED light source in embodiments increases the light-emitting angle in the plane Y and decreases the light-emitting angle in the plane X. It is noted that the scattering layer in the light adjustment layer of the LED light source in embodiments of the disclosure may be laid on the whole light outlet or a part of the light outlet, and the light gathering layer is located above the scattering layer. In addition, the prism structure units of the light gathering layer of the LED light source may be designed as triangular prisms, wavy prisms having a wave-shaped cross section or trapezoidal prisms having a trapezoidal cross section, and the prism structure units may be arranged close to each other with/without gaps between adjacent prism structure units. Structures of the scattering layer and the light gathering layer may be altered as desired in actual designs, therefore, in addition to increasing the light-emitting angle in the plane X and decreasing the light-emitting angle in the plane Y, it is also possible to increase the light-emitting angle in the plane Y and decrease the light-emitting angle in the plane X.

Figure 13:
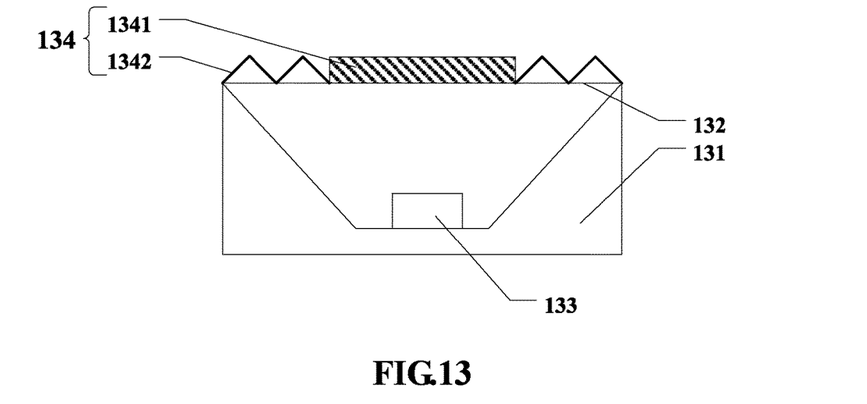
FIG. 13 is a schematic diagram of a cross-section structure of another LED light source, according to embodiments of the disclosure.

Based on the above embodiments, an LED light source is provided according to embodiments of the disclosure. Referring to FIG. 13 which is a schematic diagram of a cross-section structure of another LED light source, according to embodiments of the disclosure, the LED light source in embodiments of the disclosure includes: a housing 131, which has a light outlet 132 through which light is allowed to pass; an LED wafer 133 disposed within the housing 131, where a light-emitting surface of the LED wafer 133 faces towards the light outlet 132 of the housing 131; and a light adjustment layer 134 disposed at the light outlet 132 of the housing 131. The light adjustment layer includes a scattering layer 1341 and a light gathering layer 1342 both located at the same layer.

Based on the above embodiments, due to relatively large luminous flux at the central position of the light outlet of the LED light source, preferably, the scattering layer 1341 is located at the central position of the light outlet, and the light gathering layer 1342 is located at a peripheral position of the light outlet and is adjacent to the scattering layer, in order to further increase the light scattering efficiency.

Figure 14:
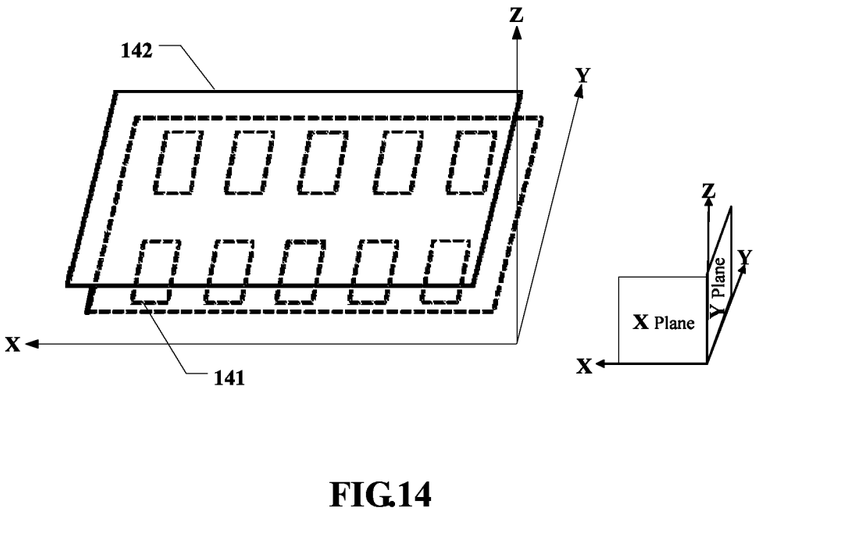
FIG. 14 is a schematic structural view of a backlight module, according to embodiments of the disclosure.

A backlight module is further provided according to embodiments of the disclosure. Referring to FIG. 14 which is a schematic structural view of a backlight module, according to embodiments of the disclosure, the backlight module includes a plurality of LED light sources 141 provided according to the above embodiments and a light guide plate 142, where the plurality of LED light sources 141 are located within the same plane and form a backlight source array, which is located in a plane below the light guide plate 142. It is noted that, for ease of illustrative description, the backlight source array is shown in FIG. 14 as including two rows and five columns, i.e. including totally ten LED light sources. The number of the LED light sources and the arrangement of the backlight source array formed by the LED light sources are not limited here.

When a scattering layer is included in the light adjustment layer of the LED light source 141, light-emitting angles of the LED light source 141 in the X-axis direction and the Y-axis direction are increased, that is, light in the plane X and the plane Y is scattered. Since the light-emitting angle of each LED light source is increased, the number of the LED light sources required for the backlight module is reduced and hence the cost is reduced. The above structure is advantageous for significantly reducing the cost of a large-sized backlight module.

Figure 15:
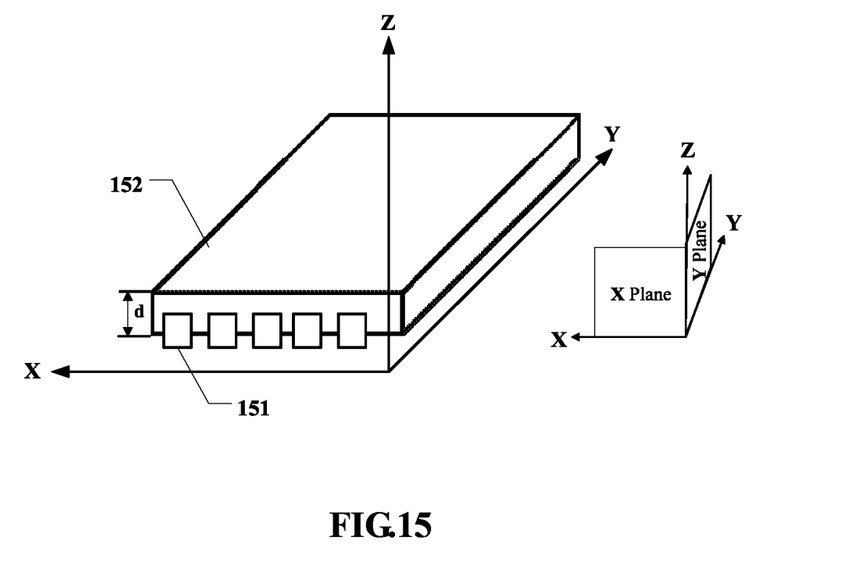
FIG. 15 is a schematic structural view of another backlight module, according to embodiments of the disclosure.

A backlight module is further provided according to embodiments of the disclosure. Referring to FIG. 15 which is a schematic structural view of another backlight module, according to embodiments of the disclosure, the backlight module includes a plurality of LED light sources 151, according to the above embodiments, and a light guide plate 152, where the plurality of LED light sources 151 are located at a lateral side of the light guide plate 152 and are located in the same plane parallel to the side surface of the light guide plate 152. It is noted that the number of the LED light sources and the arrangement of the LED light sources on the lateral side of the light guide plate are not limited in embodiments of the disclosure, and LED light sources may be further disposed on a plurality of lateral sides of the light guide plate as desired by actual designs.

Optionally, a row of LED light sources are disposed on a side surface of the light guide plate 152 along a longitudinal direction of the side surface in order to reduce the thickness of the backlight module.

If a scattering layer is included in the light adjustment layer of the LED light source, the number of LED light sources in the backlight module is reduced and hence the cost is reduced since a light-emitting angle of the LED light source is increased by the scattering layer.

If a light gathering layer is included within the light adjustment layer of the LED light source, the prism structure units of the light gathering layer are parallel to the longitudinal direction of the side surface of the light guide plate, i.e. the X-axis direction in FIG. 15, and are arranged along a short side direction of the side surface of the light guide plate, i.e. the thickness direction of the light guide plate. Light emitted by the LED light source forms an area light source by means of the light guide plate. In the above backlight module, the LED light source gathers light beyond a thickness d of the light guide plate into the range of the thickness d of the light guide plate, so that the light emitted by the LED light source is all utilized to form an area light source by means of the light guide plate, thus improving the utilization efficiency of the LED light source.

Figure 16A:
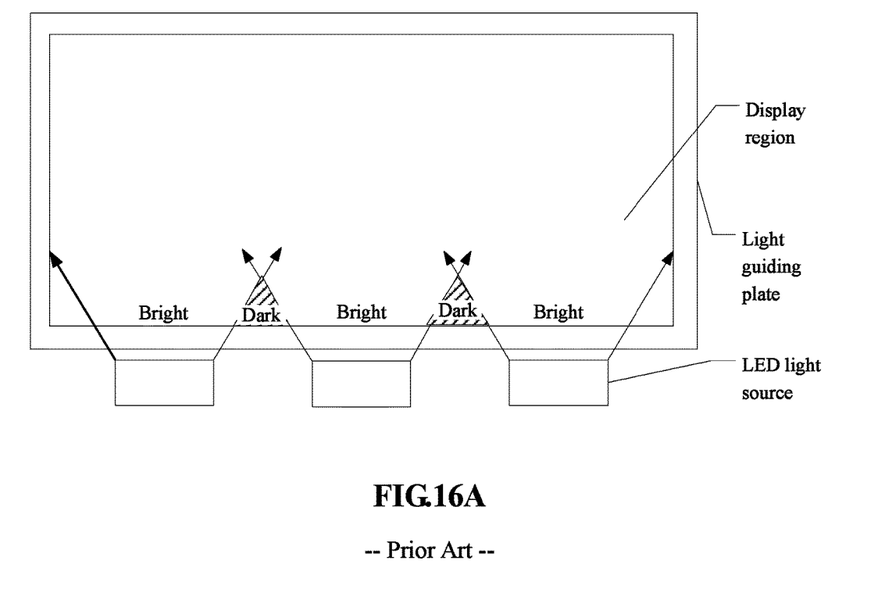
FIG. 16A is a schematic diagram showing a "firefly" phenomenon in a backlight module in the related art.
Figure 16B:
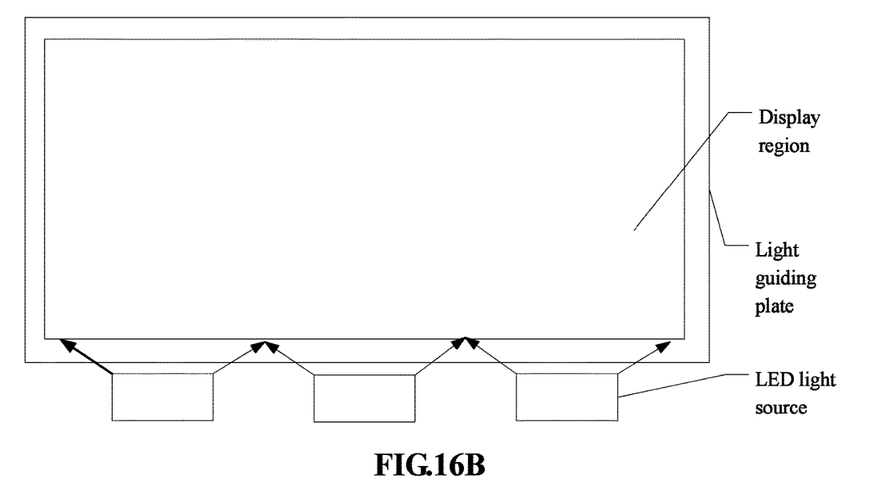
FIG. 16B is a schematic diagram showing an operation of a backlight module, according to embodiments of the disclosure.

The including of both the scattering layer and the light gathering layer in the light adjustment layer of the LED light source can increase the light-emitting angle in the X-axis direction, i.e. the light-emitting angle in the longitudinal direction of the side surface of the light guide plate, so that the number of LED light sources in the backlight module is reduced and hence the production cost is reduced. In addition, referring to FIG. 16A and FIG. 16B, FIG. 16A is a schematic diagram showing the presence of the "firefly" phenomenon in a backlight module in the related art, that is, there is an obvious phenomenon of alternating bright and dark areas, which is commonly known as the "firefly" phenomenon, in a display region of the light guide plate, because the light-emitting angle of the LED light source is small. As shown in FIG. 16B which is a schematic diagram showing an operation of a backlight module, according to embodiments of the disclosure, due to the increase of the light-emitting angle of the LED light source in the longitudinal direction of the side surface of the light guide plate, the alternating bright and dark areas are limited to be within an incident light travel, thus preventing the phenomenon of alternating bright and dark areas in the display region of the backlight module and avoiding the problem of the "firefly" phenomenon in the related art. Moreover, since the prism structure units in the light gathering layer are parallel to the longitudinal direction of the light guide plate, the light-emitting angle in the thickness direction of the light guide plate is decreased, so that light in the thickness direction of the light guide plate is gathered within the thickness range of the light guide plate, thus adequately utilizing the light emitted by the LED light source, increasing the utilization efficiency of the LED light source and reducing the light loss.

As such, the light-emitting angle of the LED light source according to any of the above embodiments of the present disclosure in a certain plane is increased or light emitted by the LED light source in a certain plane are gathered, by the light adjustment layer of the LED light source, to increase the utilization efficiency of the LED light source, so that the backlight module adopting the LED light source also possesses this advantageous effect.

Figure 17:
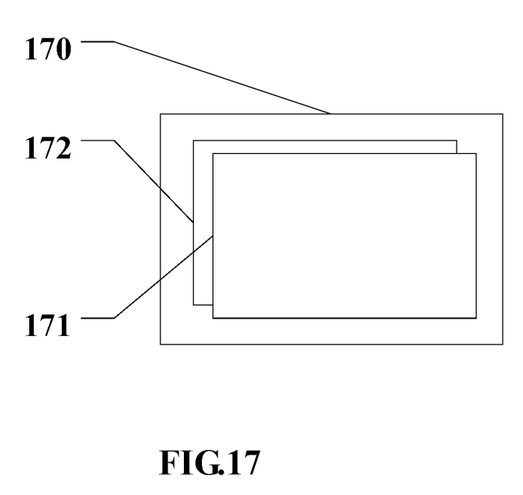
FIG. 17 is a schematic structural view of a liquid crystal display device, according to embodiments of the disclosure.

A liquid crystal display device is further provided according to embodiments of the disclosure. As shown in FIG. 17 which is a schematic structural view of a liquid crystal display device, according to embodiments of the disclosure, a liquid crystal display device 170 includes a liquid crystal display panel 171 and the backlight module 172 according to any of the above embodiments, and may further include a driving circuit and other components for supporting normal operations of the liquid crystal display device 170. The backlight module 172 is the backlight module, according to the above embodiments, and the liquid crystal display device 170 may be any one of a mobile phone, a desktop computer, a laptop computer, a tablet computer and electronic paper.

Due to the inclusion of the above backlight module, the liquid crystal display device, according to embodiments of the disclosure, also has the advantageous effects of the above backlight module.

Some embodiments and the applied technology principles of the disclosure have been described as above. However, it should be understood for those skilled in the art that the disclosure is not limited to the embodiments described herein. Various apparent changes, readjustment and alternations can be made by those skilled in the art without departing from the scope of protection of the disclosure. Therefore, although the disclosure is illustrated through the above embodiments, the disclosure is not merely limited to the above embodiments, and can further include other embodiments without departing from the scope of the disclosure.

Various modifications and additions can be made to the exemplary embodiments discussed without departing from the scope of the disclosure. For example, while the embodiments described above refer to particular features, the scope of this disclosure also includes embodiments having different combinations of features and embodiments that do not include all of the described features. Accordingly, the scope of the disclosure is intended to embrace all such alternatives, modifications, and variations as fall within the scope of the claims, together with all equivalents thereof.

I claim:

1. An LED light source, comprising:
a housing having a light outlet;
an LED wafer disposed within the housing, wherein a light-emitting surface of the LED wafer faces towards the light outlet of the housing; and
a light adjustment layer disposed at the light outlet of the housing, wherein the light adjustment layer comprises a scattering layer and a light gathering layer both located at one layer;
wherein the scattering layer is a transparent colloidal particle layer formed by transparent colloidal particles, the scattering layer is located at a central position of the light outlet and configured to diffuse light emitted by the LED light source in a plane X; and
wherein the light gathering layer is a prism layer, the prism layer comprises prism structure units arranged sequentially, each of the prism structure units comprises a triangular prism, triangular prisms in the prism structure units are arranged close to each other without gaps therebetween and arranged parallel along a Y-axis direction, the light gathering layer is located at a peripheral position of the light outlet and is adjacent to the scattering layer, and the light gathering layer is configured to gather the light emitted by the LED light source in the plane X.

2. The LED light source according to claim 1, further comprising a phosphor configured to package the LED wafer within the housing, wherein the phosphor has a light emitting surface facing towards the light outlet of the housing.

3. The LED light source according to claim 1, wherein light emitted by the LED light source comprises light in a plane X and light in a plane Y, the plane X is perpendicular to the plane Y, and the plane X and the plane Y are perpendicular to a plane where the light outlet is located; and wherein the light adjustment layer comprises a scattering layer which is configured to diffuse the light emitted by the LED light source in at least one of the plane X or the plane Y.

4. The LED light source according to claim 1, wherein the transparent colloidal particles in the transparent colloidal particle layer comprise at least one of SiO2 particles, acrylic particles or nylon particles.

5. The LED light source according to claim 4, wherein a particle radius of the transparent colloidal particle is in a range from 3 µm to 5 µm.

6. The LED light source according to claim 1, wherein light emitted by the LED light source comprises light in a plane X and light in a plane Y, the plane X is perpendicular to the plane Y, and the plane X and the plane Y are perpendicular to a plane where the light outlet is located; and wherein the light adjustment layer comprises a light gathering layer which is configured to gather light in the plane X or the plane Y.

7. The LED light source according to claim 1, wherein the prism structure unit comprises a triangular prism, a wavy prism and/or a trapezoidal prism.

8. The LED light source according to claim 1, wherein the prism layer is formed by a coated or transfer printed UV curing adhesive; and the prism structure units are arranged close to each other.

9. The LED light source according to claim 1, wherein the light adjustment layer comprises a scattering layer and a light gathering layer located on the scattering layer.

10. A backlight module, comprising a plurality of the LED light source according to claim 1, and a light guide plate;
wherein the LED light sources are located in the same plane and form a backlight source array, and a plane where the backlight source array is located is right below the light guide plate; or, the LED light sources are located at a side surface of the light guide plate and are located in the same plane, and a plane where the LED light sources are located is parallel to the side surface of the light guide plate.

11. The backlight module according to claim 10, wherein light emitted by the LED light source comprises light in a plane X and light in a plane Y, the plane X is perpendicular to the plane Y, and the plane X and the plane Y are perpendicular to a plane where the light outlet is located; and wherein the light adjustment layer comprises a scattering layer which is configured to diffuse the light emitted by the LED light source in at least one of the plane X or the plane Y.

12. The backlight module according to claim 10, wherein light emitted by the LED light source comprises light in the plane X and light in a plane Y, the plane X is perpendicular to the plane Y, and the plane X and the plane Y are perpendicular to a plane where the light outlet is located.

13. The backlight module according to claim 10, wherein the prism structure units of the prism layer are parallel to a longitudinal direction of a side surface of the light guide plate, and are sequentially arranged along a short side direction of the side surface of the light guide plate.

14. A liquid crystal display device, comprising a liquid crystal display panel and the backlight module according to claim 10.

* * * * *